(12) United States Patent
Yi

(10) Patent No.: US 7,674,693 B2
(45) Date of Patent: Mar. 9, 2010

(54) METHOD FOR MANUFACTURING SEMICONDUCTOR DEVICE

(75) Inventor: Jae Yun Yi, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 867 days.

(21) Appl. No.: 11/448,745

(22) Filed: Jun. 8, 2006

(65) Prior Publication Data

US 2007/0173038 A1    Jul. 26, 2007

(30) Foreign Application Priority Data

Jan. 23, 2006    (KR)    ............ 10-2006-0006972

(51) Int. Cl.
*H01L 21/20* (2006.01)
(52) U.S. Cl. .................. 438/481; 257/E21.655; 438/243; 438/259
(58) Field of Classification Search ............ 438/243, 438/481.592; 257/E21.655
See application file for complete search history.

(56) References Cited

U.S. PATENT DOCUMENTS

2006/0134858 A1*  6/2006  Yamazaki .......... 438/243

FOREIGN PATENT DOCUMENTS

KR    1020010054295 A    7/2001

* cited by examiner

*Primary Examiner*—W. David Coleman
*Assistant Examiner*—Sonya D McCall-Shepard
(74) *Attorney, Agent, or Firm*—Townsend and Townsend and Crew LLP

(57) ABSTRACT

A method forming a semiconductor device includes forming a domed gate oxide film to relieve stress resulting from a thermal expansion rate difference of an oxide film and silicon film during a subsequent thermal process and preventing leakage current between source/drain regions through thickness regulation of the gate oxide film to improve refresh characteristics.

5 Claims, 4 Drawing Sheets

METHOD FOR MANUFACTURING SEMICONDUCTOR DEVICE

BACKGROUND OF THE INVENTION

1. Field of the Invention

The present invention generally relates to a method for manufacturing a semiconductor device, and more specifically, to a technique of forming a domed gate oxide film to relieve stress, which results from different thermal expansive rates between an oxide film and a silicon film during a subsequent thermal process and preventing leakage current between source/drain regions by controlling the thickness of the gate oxide film to improve there fresh characteristics.

2. Description of the Related Art

FIGS. 1a through 1d are cross-sectional diagrams illustrating a method for manufacturing a semiconductor device.

Referring to FIG. 1a, a silicon germanium (hereinafter, referred to as "SiGe") layer 20 is formed over a semiconductor substrate 10, and grown to form a silicon epitaxial layer 30a. Then, a hard mask layer 40 is formed over the silicon epitaxial layer 30a.

Thereafter, a photoresist film pattern (not shown) that exposes a gate region is formed, and the hard mask layer 40, the silicon epitaxial layer 30a and the SiGe layer 20 are etched using the photoresist film pattern as an etching mask to expose the semiconductor substrate 10.

Referring to FIG. 1b, after the hard mask layer 40 is removed, the exposed region during the etching process is filled with the silicon epitaxial layer 30b using a Silicon Epitaxial Growth (hereinafter, referred to as "SEG") method.

Referring to FIG. 1c, the STI process is performed to form a trench, and the SiGe layer 20 is removed with an etchant.

Here, the top of the silicon epitaxial layer 35 is supported by the silicon epitaxial layer 35 at the side of the SiGe layer 20.

Referring to FIG. 1d, a device isolation film (not shown) is formed, and simultaneously a region 25 where the SiGe layer 20 is removed is filled with an oxide film 50.

Next, a deposition layer including a gate polysilicon film 60, a gate metal layer 70 and a gate hard mask layer 80 is formed on the entire surface of the semiconductor substrate 10. The deposition structure is etched to form a gate pattern.

Then, a spacer 90 is formed at a sidewall of the gate pattern to form a gate.

However, the above-described method for manufacturing the semiconductor device is expensive because the formation of the SiGe layer is costly, and has a degraded reliability to manufacture.

Also, an oxide film having a Silicon On Insulator (hereinafter, referred to as "SOI") structure is formed flat, which causes leakage current between source/drain regions. The oxide film that fills the region where the SiGe layer is removed has a degraded gap-fill characteristics.

Furthermore, contraction and expansion which result from the thermal of the oxide film and silicon film applies stress to the inside of the device, which results in degradation of device characteristics. Although the silicon epitaxial layer at the side of the SiGe layer is required to support the top of the silicon epitaxial layer after the SiGe layer is removed, the silicon epitaxial layer may be collapsed by the stress applied to the semiconductor substrate.

SUMMARY OF THE INVENTION

Various embodiments are directed at providing a method for manufacturing a semiconductor device wherein a domed gate oxide film is formed to relieve the stress resulting from a thermal expansive rate of an oxide film and silicon film during a subsequent thermal process and to prevent leakage current between source/drain regions through thickness regulation of the gate oxide film to improve the refresh characteristics.

According to an embodiment of the present invention, a method for manufacturing a semiconductor device comprises:

(a) etching a semiconductor substrate of a storage contact region and a bit line contact region at a predetermined thickness to form a recess region;

(b) forming an oxide film having a predetermined thickness in the recess region;

(c) growing a silicon epitaxial layer on the entire surface of the semiconductor substrate including the recess region; and (d) forming a deposition structure including a gate polysilicon layer, a gate metal layer and a gate hard mask layer over the silicon epitaxial layer and then etching the deposition structure to form a gate pattern.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like parts.

FIGS. 2a through 2e are cross-sectional diagrams illustrating a method for manufacturing a semiconductor device according to an embodiment of the present invention.

Figure 1A:
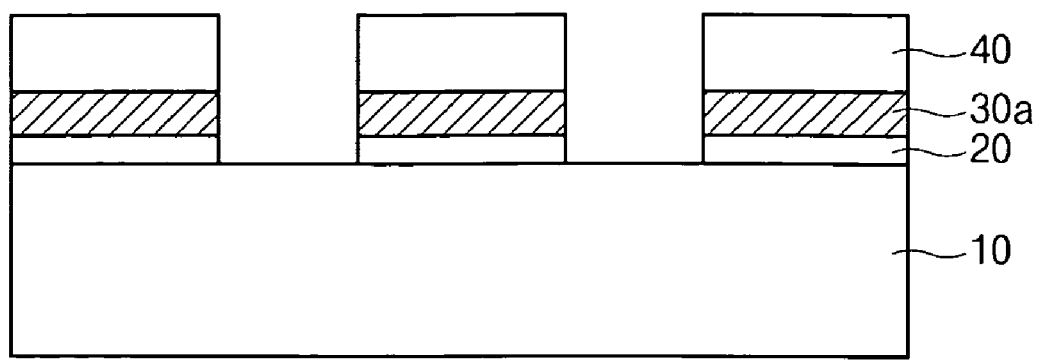
FIGS. 1a through 1d are cross-sectional diagrams illustrating one method for manufacturing a semiconductor device.
Figure 1B:
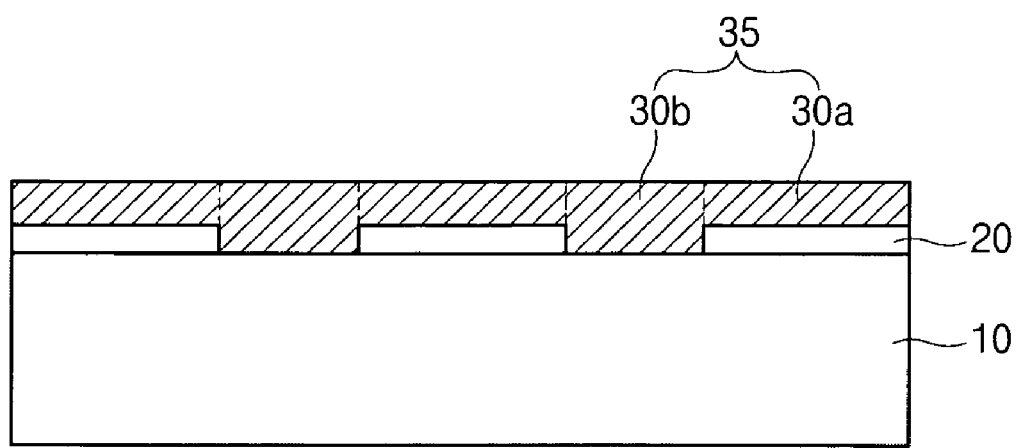
Figure 1C:
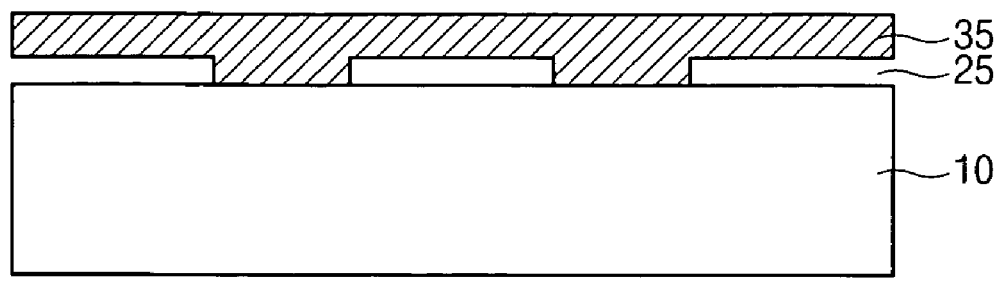
Figure 1D:
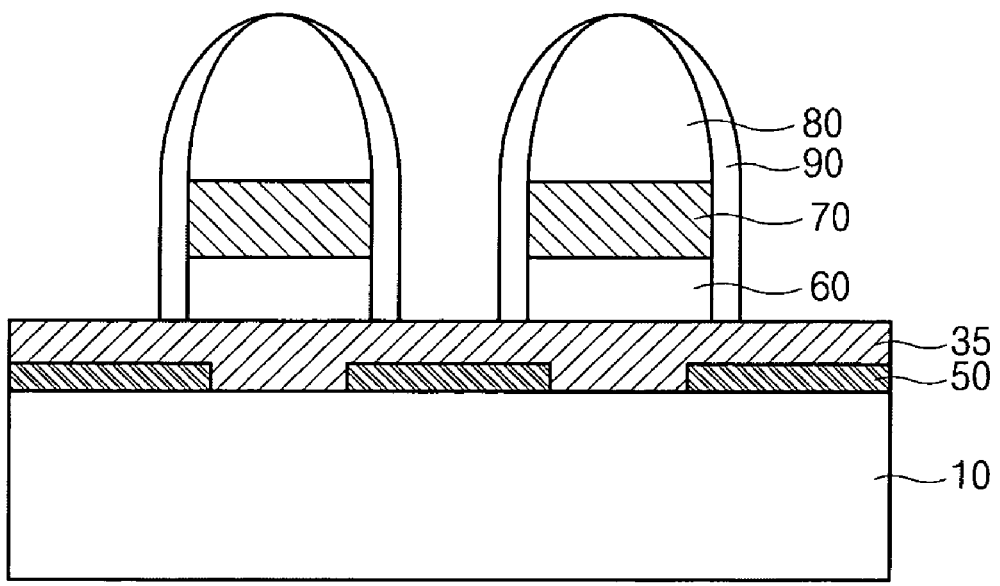
Figure 2A:
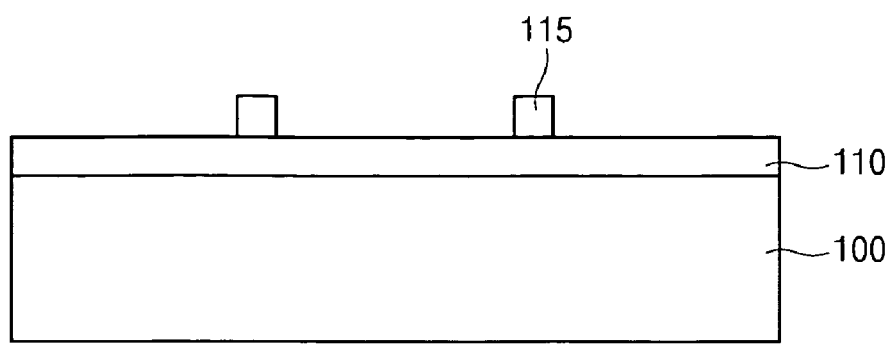
FIGS. 2a through 2e are cross-sectional diagrams illustrating a method for manufacturing a semiconductor device according to an embodiment of the present invention.

Referring to FIG. 2a, a hard mask layer 110 is formed over a semiconductor substrate 100, and a photoresist film pattern 115 that exposes a storage electrode contact region and a bit line contact region is formed.

Figure 2B:
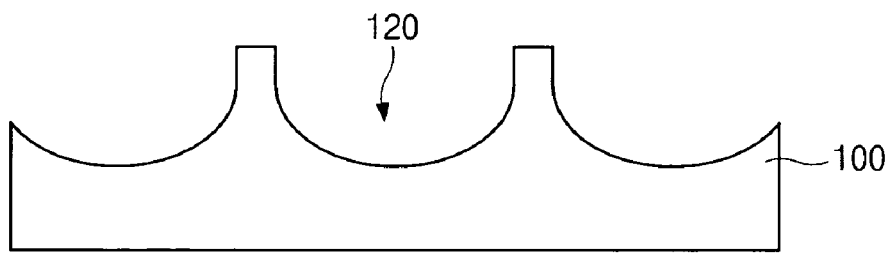

Referring to FIG. 2b, the hard mask layer 110 is etched with the photoresist film pattern 115 to form a hard mask layer pattern (not shown). After the photoresist film pattern 115 is removed, the semiconductor substrate 100 is etched with the hard mask layer pattern (not shown) as a mask to form a domed recess region 120.

Preferably, the recess region 120 is etched at a thickness ranging from 1000 to 2000 Å.

Figure 2C:
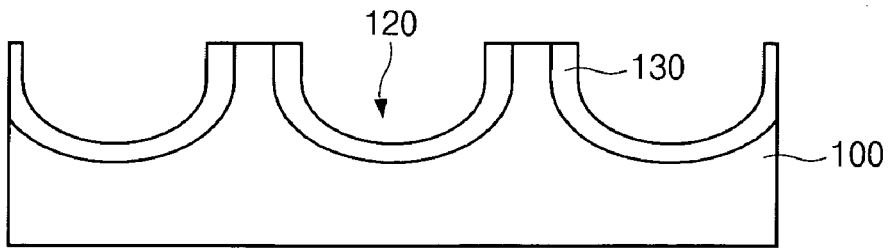

Referring to FIG. 2c, a gate oxide film 130 having a predetermined thickness is formed on the entire surface of the semiconductor substrate 100 including the recess region 120. Then, a CMP process is performed to expose the semiconductor substrate 100.

The gate oxide film 130 is preferably formed with a domed type at a thickness ranging from 20 to 100 nm to prevent stress which results from a thermal expansion rate difference of the oxide film and silicon film during a subsequent thermal process.

Figure 2D:
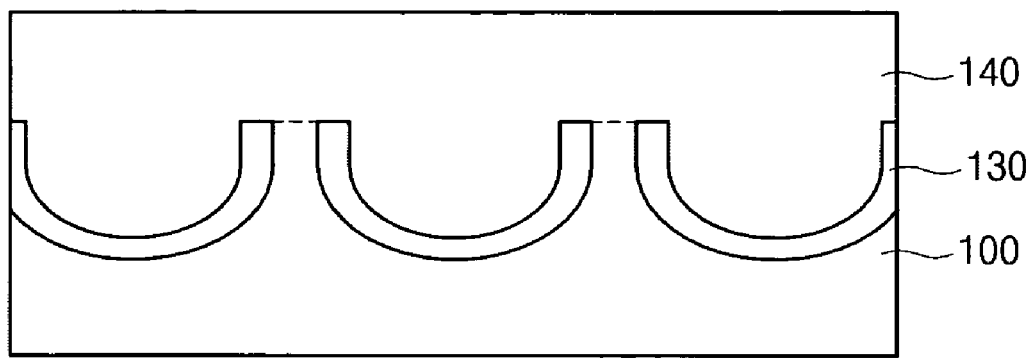

Referring to FIG. 2d, a SEG process is performed with a silicon film of the exposed semiconductor substrate 100 as the seed to grow a silicon epitaxial layer 140 on the entire surface of the semiconductor substrate 100.

Here, a distance between the silicon epitaxial layer 140 and the gate oxide film 130 is regulated at a thickness ranging from 5 to 500 Å to prevent leakage current between source/drain regions.

Figure 2E:
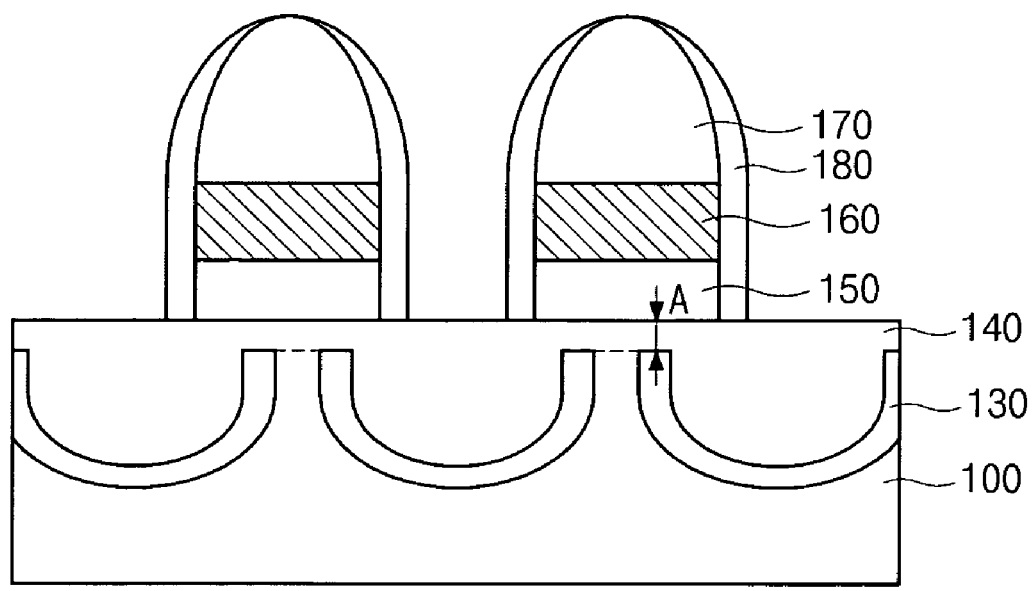

Referring to FIG. 2e, a deposition structure including a gate polysilicon layer 150, a gate metal layer 160 and a gate hard mask layer 170 is formed on the entire surface of the semiconductor substrate 100. The deposition structure is etched to form a gate pattern.

Then, a spacer 180 is formed at a sidewall of the gate pattern to form a gate.

As described above, according to a method for manufacturing a semiconductor device, a domed gate oxide film is formed to easily relieve stress and prevent leakage current between source/drain regions through regulation of distance from a gate oxide film to a silicon epitaxial layer (see 'A' of FIG. 2e), thereby improving the refresh characteristics.

Additionally, since a general DRAM process can be used without any change, there are no problems due to addition of new processes. By using conventional processes such as a recess gate process, an oxidation process and a SEG process, a SOI structure may be made more easily.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A method for manufacturing a semiconductor device, the method comprising:
    etching a semiconductor substrate in a storage contact region and a bit line contact region at a predetermined thickness to form a recess region;
    forming a gate oxide film having a predetermined thickness on an entire surface of the semiconductor substrate including the recess region;
    performing a CMP process to expose the semiconductor substrate;
    growing a silicon epitaxial layer on the entire surface of the semiconductor substrate including the recess region; and
    forming a deposition structure including a gate polysilicon layer, a gate metal layer and a gate hard mask layer over the silicon epitaxial layer and then etching the deposition structure to form a gate pattern.

2. The method according to claim 1, wherein the recess region is formed with a domed type at a thickness ranging from about 1000 to about 2000 Å.

3. The method according to claim 1, wherein the exposed semiconductor substrate is used as a seed of the silicon epitaxial layer.

4. The method according to claim 1, wherein the gate oxide film is formed at a thickness ranging from about 20 to 100 nm.

5. The method according to claim 1, wherein the silicon epitaxial layer is formed at a thickness ranging from about 5 to about 500 Å from the top of the gate oxide film.

* * * * *